(12) United States Patent
Chen et al.

(10) Patent No.: US 9,231,172 B2
(45) Date of Patent: Jan. 5, 2016

(54) SCREEN PRINTING METHOD OF LED MODULE WITH PHOSPHOR

(71) Applicant: XIAMEN FRIENDLY LIGHTING TECHNOLOGY CO., LTD., Xiamen, Fujian (CN)

(72) Inventors: Nuocheng Chen, Xiamen (CN); Yong Liao, Xiamen (CN); Chungyi Lu, Xiamen (CN)

(73) Assignee: XIAMEN FRIENDLY LIGHTING TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 14/391,213

(22) PCT Filed: May 29, 2013

(86) PCT No.: PCT/CN2013/076431
§ 371 (c)(1),
(2) Date: Oct. 8, 2014

(87) PCT Pub. No.: WO2014/008788
PCT Pub. Date: Jan. 16, 2014

(65) Prior Publication Data
US 2015/0140706 A1 May 21, 2015

(30) Foreign Application Priority Data
Jul. 9, 2012 (CN) .......................... 2012 1 0236131

(51) Int. Cl.
*H01L 21/00* (2006.01)
*H01L 33/50* (2010.01)
(Continued)

(52) U.S. Cl.
CPC .............. *H01L 33/505* (2013.01); *H01L 33/44* (2013.01); *B41M 3/006* (2013.01); *H01L 33/50* (2013.01); *H01L 2933/0041* (2013.01)

(58) Field of Classification Search
CPC .................. H01L 21/78; H01L 33/00; H01L 2924/07802; H01L 2924/07811; H01L 2924/0002; H01L 2224/24501; H01L 33/505; H01L 33/50; H01L 2933/0041; H01L 33/486; H01L 2224/73265; H01L 33/62; H01L 2924/01029
USPC ............................................................ 438/29
See application file for complete search history.

(56) References Cited

U.S. PATENT DOCUMENTS

2006/0055309 A1* 3/2006 Ono ..................... H01L 25/0753
313/492
2008/0036362 A1* 2/2008 Tanimoto et al. ............. 313/498
(Continued)

FOREIGN PATENT DOCUMENTS

CN 101099964 A 1/2008
CN 101894889 A 11/2010
(Continued)

*Primary Examiner* — Jessica Stultz
*Assistant Examiner* — Vu A Vu
(74) *Attorney, Agent, or Firm* — Rabin & Berdo, P.C.

(57) ABSTRACT

A screen printing method of LED module with phosphor includes: board preparation providing an LED module board with a substrate and a plurality of LED sources fixed on the substrate. The LED sources are flip chip structural and the metal electrodes thereof are fixed to the bonding pads of the substrate. A screen board is provided with meshes corresponding to the shiny sides of the LED sources of the substrate one by one. A projection of each mesh to the shiny side of the corresponding LED source has similar shape with the shiny side of the LED source. The top of the screen board is printed with allocated colloidal phosphor until each mesh is coated fully. The printed substrates are baked to solidify the phosphor. The periphery of the shiny side is fully coated.

9 Claims, 3 Drawing Sheets

(51) Int. Cl.
*H01L 33/44* (2010.01)
*B41M 3/00* (2006.01)

(56) References Cited

U.S. PATENT DOCUMENTS

| | | | |
|---|---|---|---|
| 2010/0127290 A1 | 5/2010 | Joo et al. | |
| 2011/0014732 A1* | 1/2011 | Lee | 438/27 |
| 2012/0052608 A1* | 3/2012 | Yoo | H01L 33/505 |
| 2012/0142124 A1* | 6/2012 | Yoo et al. | 438/27 438/16 |
| 2012/0261699 A1* | 10/2012 | Ooyabu | H01L 33/56 257/98 |

FOREIGN PATENT DOCUMENTS

| | | |
|---|---|---|
| CN | 102795005 A | 11/2012 |
| CN | 102956797 A | 3/2013 |
| JP | 2001308391 A | 11/2001 |

* cited by examiner

SCREEN PRINTING METHOD OF LED MODULE WITH PHOSPHOR

FIELD OF THE INVENTION

The present invention relates to a LED module manufacturing technique, especially to a screen printing method of LED module with phosphor.

BACKGROUND OF THE INVENTION

In illumination field, white LED sources are developed to be a matured technology, the most widely used while LED source is applied with a blue LED combined with phosphor, which is stimulated to emit yellow light, the blue light and the yellow light mix to get a white chromatic spectrum.

As the LED sources are small in size, if high luminous flux and high power are needed, it has to provide many LED sources, a traditional method is to use single white sources fixed in a same substrate to provide an LED module with enough luminous flux, this method has complete production chains, the technique thereof is relative matured, however, unavoidable, every single LED source needs individual package process, it means that every single LED source needs a complete manufacturing of bonding, potting, coating and packing, although it has made a production on a large scale, the package material and manufacturing during are unavoidable.

Aiming at this problem, existing technology is applied with COB (chip-on-board) method, that is to say, directly fixing the LED chips on the substrate, getting the LED module without packing, then coating the entire LED module with phosphor, finally packing the substrate with many LED sources, it reduces the material cost and manufacturing during of every single LED source, thus improving the manufacturing cost and during of a LED module. however, according to the character of the LED sources, light photon emits to the free space from the semiconductor chip after multiple total reflections and/or refractions, the top and sides of the chip send luminous flux, so the best condition is that the phosphor is evenly coating on every shiny side, thus ensuring the consistency of the photochromic of the mixing light in the emit angle; but in the LED module applied with COB method, when coating the phosphor, it is hard to obtain the consistency of the geometry of the phosphor of every single LED source when in high efficiency and large scale coating, resulting in inconsistency of the photochromic of LED module in different emit angles, thus reducing the quality of white light illumination, even resulting in uncomfortable, especially in non-planar substrate, it is more hard to guarantee an even coating; in case to efficiently coating on every LED chip, it resumes much phosphor to coat the sides of the LED chips, thus resulting in a waste of phosphor.

SUMMARY OF THE INVENTION

A first object of the present invention is to provide with a screen printing method of LED module with phosphor, which overcomes the A screen printing method of LED module with phosphor comprising:
  board preparation: providing an LED module board, the LED module board comprises a substrate and a plurality of LED sources fixed on the substrate; the LED sources are flip chip structural, the metal electrodes thereof are fixed to the bonding pads of the substrate;
  screen setting: providing a screen board, the meshes thereof are corresponding to the shiny sides of the LED sources of the substrate one by one, a projection of each mesh to the shiny side of the corresponding LED source has similar shape with the shiny side of the LED source, the projection size of each mesh is 1.03 to 1.2 of the size scale of the shiny side of the corresponding LED source; the distance between the bottom of the screen board and the LED sources is 0.2-1 mm;
  printing: printing the top of the screen board with allocated colloidal phosphor until each mesh is coated fully, before removing the screen board; and
  forming: baking the printed substrates in a baker to solidify the phosphor.

In another preferred embodiment, the shiny sides of the LED sources of the substrate have similar shape and same height.

In another preferred embodiment, the kinematic viscosity of the allocated phosphor is 70-800 mm$^2$/s when printing.

In another preferred embodiment, the screen board is a stainless steel sheet; the thickness of the mess stays the same in the periphery.

In another preferred embodiment, the forming step comprises a standing step, after the screen board is removed, the substrate coated with phosphor stands for a while.

In another preferred embodiment, the LED chips of the LED module are 440-470 nm blue LED chips; the phosphor converts blue light to yellow light.

In another preferred embodiment, the substrate is a fiber glass, ceramic or metal sheet.

The advantages of the present invention are:

1. The periphery of the shiny side is fully coated, thus ensuring the consistency of the photochromic of the mixing light in the emit angle.

2. The screen printing can quickly finish the phosphor coating of all LED sources in the whole substrate, beside, the substrate and the screen board can be non-planar, so that the quick coating technique is not limited by planeness or material, no matter fiber glass, ceramic or metal, it is available to adapt with a curve shape of a substrate or different shapes of LED sources on a same substrate, the phosphor coating technology costs short during.

3. No superfluous phosphor is dropped to the surface of the substrate or other place, so that it is not a waste of resource.

BRIEF DESCRIPTION OF THE DRAWINGS

The present invention will be further described with the drawings and embodiments.

DETAILED DESCRIPTION OF THE EMBODIMENTS

Figure 1:
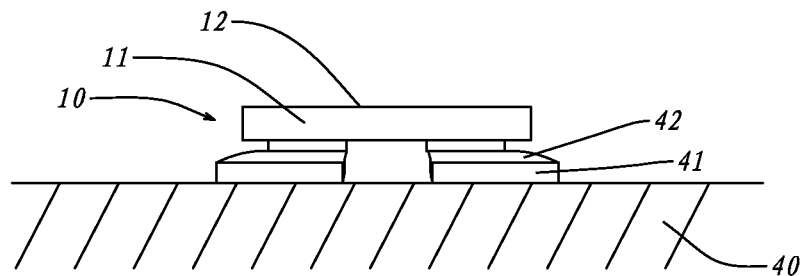
FIG. 1 illustrates a side view of a substrate 40 in the board preparation procedure in the preferred embodiment of the present invention.

As figure in FIG. 1, the manufacture object of this embodiment is an LED module board, the LED module board comprises a substrate 40 and other fittings thereon. The flat shaped substrate 40 is made of aluminum, with well heat conduction performance, the substrate 40 is disposed with circuits and corresponding bonding pads 41, thereinto the bonding pads 41 are in pairs corresponding to the metal electrodes 13 below each LED source 10, the LED source 10 is flip chip structural, and is 455 nm blue; as the main body 11 of each LED source 10 has a PN junction corresponding to the positive and negative metal electrodes 13, a shiny side 12 is opposite to the metal electrodes 13. The substrate 40 is two-dimensionally distributed with a plurality of LED sources 10 in the form of FIG. 1. in particular, the LED sources 10 of this embodiment have a same specification, the metal electrodes 13 thereof are welded to the bonding pads 41 with same technology, so that the LED source 10 and the substrate 40 forms an entirety available to be luminous when switched on, and all LED sources 10 have same height, shape and same shiny side 12.

Figure 2:
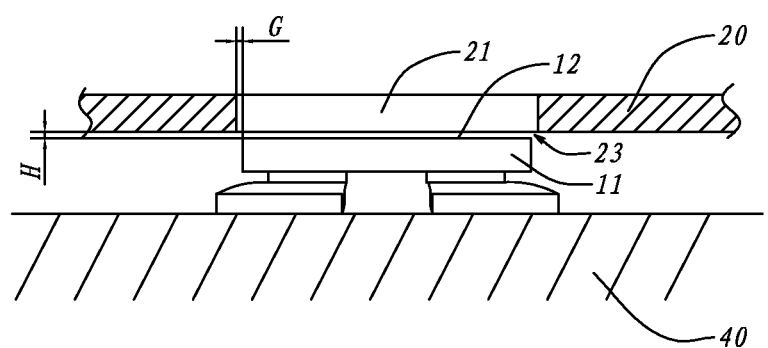
FIG. 2 illustrates a side view of relative position of a screen board 20 and an LED source 10 in the screen setting procedure after the procedure of FIG. 1.
Figure 3:
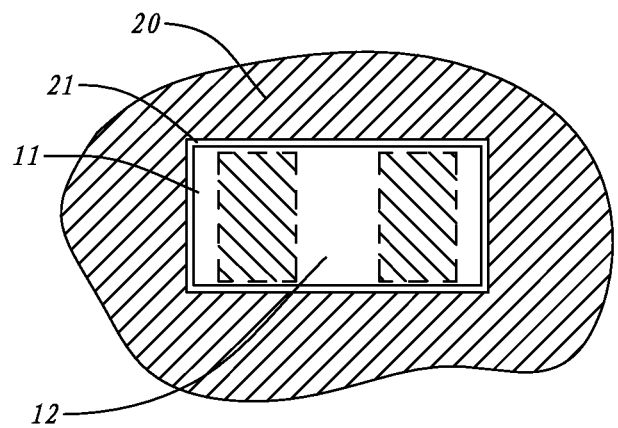
FIG. 3 illustrates a top view of FIG. 2.

As figured in FIG. 2 and FIG. 3, a stainless steel screen board 20 is stably placed above the shiny sides 12 of all LED sources 10, in the position of every shiny side 12, a mesh 21 is correspondingly disposed in the screen board 20; a projection of the mesh 21 to the shiny side 12 of the LED source is similar to the shiny side 12 in shape, the shiny side 12 in this embodiment is rectangle, the mesh 21 is rectangle as well, the size scale of the mesh 21 is 1.03 of that of the shiny side 12, and has a length increment G, a distance H between the bottom surface of the mesh 20 and the shiny side 12 is 1 mm, this embodiment is applicable with large size LED sources, like high power LED chips with about 40 mil size scale. As with the size relationship between a mesh 21 and a shiny side 12 and with the distance between two plates, a clearance 23 is obviously disposed between the external periphery of the shiny side 12 of the main body 11 and the internal periphery of the mesh 21. Viewed from the mesh 21, the outline of the shiny side 12 is visible.

Figure 4:
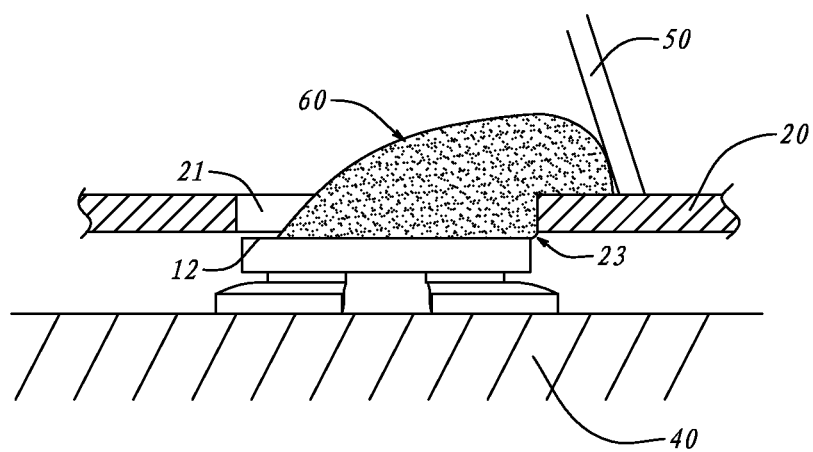
FIG. 4 illustrates a sectional view of an LED source and a mesh 21 in the printing procedure after the procedure of FIG. 2, thereinto a scraper 50 is used to push the phosphor 60 on the screen board, some phosphor 60 drops to the mesh 21.
Figure 5:
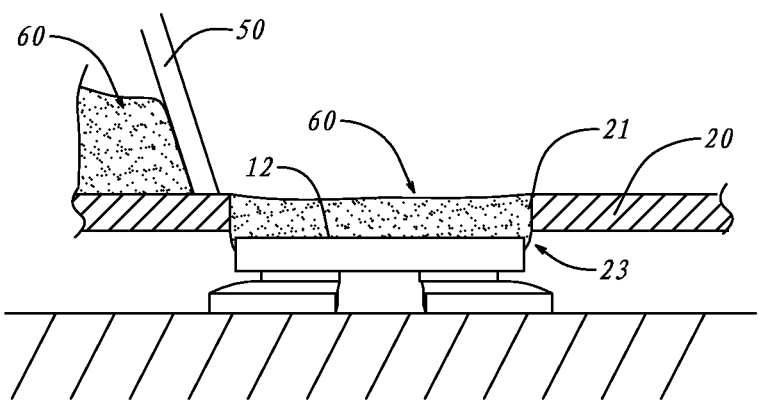
FIG. 5 illustrates another state of FIG. 4 when the scraper 50 passes totally across the mesh 21 resulting in filling up the mesh 21 with phosphor 60.

As figured in FIG. 4 and FIG. 5, in the printing procedure, putting the allocated colloidal phosphor 60 on the top surface of the screen board 20 to screen print, using a scraper 50 to push and press the phosphor 60 on the top surface of the screen board 20, so that the meshes 21 are filled up when the phosphor 60 passes over the meshes 21 under the work of the gravity itself and the pressure of the scraper 50, on the one hand, the bottom side of the meshes 21 is the shiny sides 12, so that the shiny side 12 and the internal periphery of the mesh 21 form a profile of an accommodating room; on the other hand, with clearance 23, air inside the accommodating room is discharging out promptly, so that the phosphor 60 can reach all the way of the periphery of the shiny side 12. the phosphor 60 is used to convert blue light to yellow light, the kinematic viscosity of the allocated gelatinous phosphor is 200 mm$^2$/s when printing.

When the scraper 50 pushes the phosphor 60 several times to pass over the meshes 21 by a set procedure, it becomes to a condition as figured in FIG. 5, in this condition, some phosphor 60 is filled up the meshes 21, and a thickness is defined by the width of the internal periphery of the mesh 21. in this embodiment, the widths of the internal periphery of the meshes 21 stay the same, so that the thickness of the phosphor 60 stay the same in a same shiny sides 12 accurately.

Figure 6:
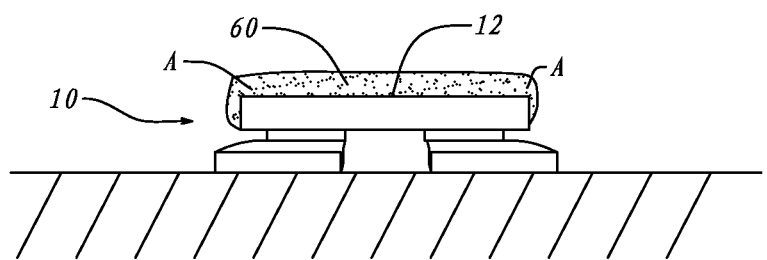
FIG. 6 illustrates a side view of the LED chip and the substrate 40 after the forming procedure.

After above procedure, removing the screen board 20 of FIG. 5 (the some phosphor needs to stand for a while to make it fully flowing and moulding), then baking the whole substrate 40 into a baker to solidify the phosphor 60, resulting in a condition as figured in FIG. 6. the phosphor 60 is coated on the shiny side 12 evenly, particularly in the periphery area A of the shiny side 12, the thickness of the phosphor 60 is fully retained, so that light of every single LED source 10 penetrates fully. The phosphor 60 makes the consistency of the photochromic of the mixing light well in the emit angle.

Seen from above, in this embodiment, the periphery of the shiny side 12 is fully coated, thus ensuring the consistency of the photochromic of the mixing light in the emit angle; in addition, the screen printing can quickly finish the phosphor coating of all LED sources in the whole substrate, beside, the substrate 40 and the screen board 20 can be non-planar, so that the quick coating technique is not limited by planeness or material, no matter fiber glass, ceramic or metal, it is available to adapt with a curve shape of a substrate 40 or different shapes of LED sources 10 on a same substrate 40, the phosphor coating technology costs short during.

In particular, in the present invention, no superfluous phosphor 60 is dropped to the surface of the substrate 40 or other place, so that it is not a waste of resource. Especially for flip chip structural LED sources array distributed in a flat substrate, the advantages of the method of the present invention are very clear.

Although the present invention has been described with reference to the preferred embodiments thereof for carrying out the patent for invention, it is apparent to those skilled in the art that a variety of modifications and changes may be made without departing from the scope of the patent for invention which is intended to be defined by the appended claims.

INDUSTRIAL APPLICABILITY

The present invention is applied with screen printing technology for quick coating of LED sources on a substrate with phosphor, the quick coating technology is not limited by planeness or material, no matter fiber glass, ceramic or metal, it is available to adapt with a curve shape of a substrate or different shapes of LED sources on a same substrate. The phosphor coating technology costs short during.

The invention claimed is:

1. A screen printing method of LED module with phosphor, wherein the method comprising:
   board preparation: providing an LED module board, the LED module board comprises a substrate and a plurality of LED sources fixed on the substrate; the LED sources are flip chip structural, the metal electrodes thereof are fixed to the bonding pads of the substrate;
   screen setting: providing a screen board, the meshes thereof are corresponding to the shiny sides of the LED sources of the substrate one by one, a projection of each mesh to the shiny side of the corresponding LED source has similar shape with the shiny side of the LED source, the projection size of each mesh is 1.03 to 1.2 of the size scale of the shiny side of the corresponding LED source; the distance between the bottom of the screen board and the LED sources is 0.2-1 mm;
   printing: printing the top of the screen board with allocated colloidal phosphor until each mesh is coated fully, before removing the screen board; and
   forming: baking the printed substrates in a baker to solidify the phosphor.

2. The screen printing method of LED module with phosphor according to claim 1, wherein the shiny sides of the LED sources of the substrate have similar shape and same height.

3. The screen printing method of LED module with phosphor according to claim 1, wherein the kinematic viscosity of the allocated phosphor is 70-800 mm$^2$/s when printing.

4. The screen printing method of LED module with phosphor according to claim 3, wherein
the screen board is a stainless steel sheet;
the thickness of the mesh stays the same in the periphery.

5. The screen printing method of LED module with phosphor according to claim 1, wherein
the forming step comprises a standing step,
after the screen board is removed, the substrate coated with phosphor stands for a while.

6. The screen printing method of LED module with phosphor according to claim 1, wherein
the LED chips of the LED module are 440-470 nm blue LED chips;
the phosphor converts blue light to yellow light.

7. The screen printing method of LED module with phosphor according to claim 1, wherein the substrate is a fiber glass, ceramic or metal sheet.

8. The screen printing method of LED module with phosphor according to claim 2, wherein the kinematic viscosity of the allocated phosphor is 70-800 mm$^2$/s when printing.

9. The screen printing method of LED module with phosphor according to claim 8, wherein
the screen board is a stainless steel sheet;
the thickness of the mesh stays the same in the periphery.

* * * * *